(12) United States Patent
Chung

(10) Patent No.: US 9,106,127 B2
(45) Date of Patent: Aug. 11, 2015

(54) CHARGE PUMP APPARATUS AND CHARGE PUMPING METHOD

(75) Inventor: Kyu-young Chung, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 735 days.

(21) Appl. No.: 12/903,369

(22) Filed: Oct. 13, 2010

(65) Prior Publication Data
US 2011/0109375 A1    May 12, 2011

(30) Foreign Application Priority Data
Nov. 12, 2009    (KR) .......................... 10-2009-109194

(51) Int. Cl.
G05F 1/10 (2006.01)
G05F 3/02 (2006.01)
H02M 3/07 (2006.01)
G11C 5/14 (2006.01)

(52) U.S. Cl.
CPC *H02M 3/07* (2013.01); *G11C 5/145* (2013.01)

(58) Field of Classification Search
CPC . H02M 3/073; H02M 3/07; H02M 2003/077; G11C 5/145; G05F 3/205
USPC ...................................... 327/536; 363/59–60
See application file for complete search history.

(56) References Cited

U.S. PATENT DOCUMENTS

| 6,563,235 | B1 * | 5/2003 | McIntyre et al. ............. 307/109 |
| 7,119,604 | B2 | 10/2006 | Chih |
| 2005/0280463 | A1 * | 12/2005 | Chih ............................. 327/538 |
| 2007/0075765 | A1 | 4/2007 | Kawagoshi |
| 2007/0273430 | A1 | 11/2007 | Akashi et al. |
| 2008/0084239 | A1 * | 4/2008 | Oswald et al. ................ 327/536 |
| 2009/0184753 | A1 | 7/2009 | Kawashima et al. |
| 2009/0256626 | A1 * | 10/2009 | Hsieh et al. ................... 327/536 |

FOREIGN PATENT DOCUMENTS

| CN | 1941577 A | 4/2007 |
| CN | 101083431 A | 12/2007 |
| CN | 101534049 A | 9/2009 |
| TW | 200842888 A | 11/2008 |

OTHER PUBLICATIONS

Chinese Office Action issued Feb. 8, 2014 in counterpart Chinese Patent Application No. 201010546603.3. (13 pages in Chinese).
Taiwanese Office Action issued Nov. 19, 2014 in counterpart Taiwanese Application No. 099137839 (11 pages, in Taiwanese, with English Language translation).

* cited by examiner

*Primary Examiner* — Quan Tra
(74) *Attorney, Agent, or Firm* — NSIP Law

(57) ABSTRACT

A charge pumping method includes: generating a first boosted voltage by boosting an input voltage by a boosting mode of a first multiplier; changing the level of a voltage charged in at least one capacitor provided in the inside of a charge pump circuit, in preparation for a change in the boosting mode; and generating a second boosted voltage by boosting the input voltage by a boosting mode of a second multiplier.

6 Claims, 14 Drawing Sheets

PHASE 1

PHASE 2

PHASE 1

PHASE 2

X1.5 PHASE 1

X1.5 PHASE 2

INITIALIZATION PHASE

X2.5 PHASE 1

X2.5 PHASE 2

INITIALIZATION PHASE

X3 PHASE 1

X3 PHASE 2

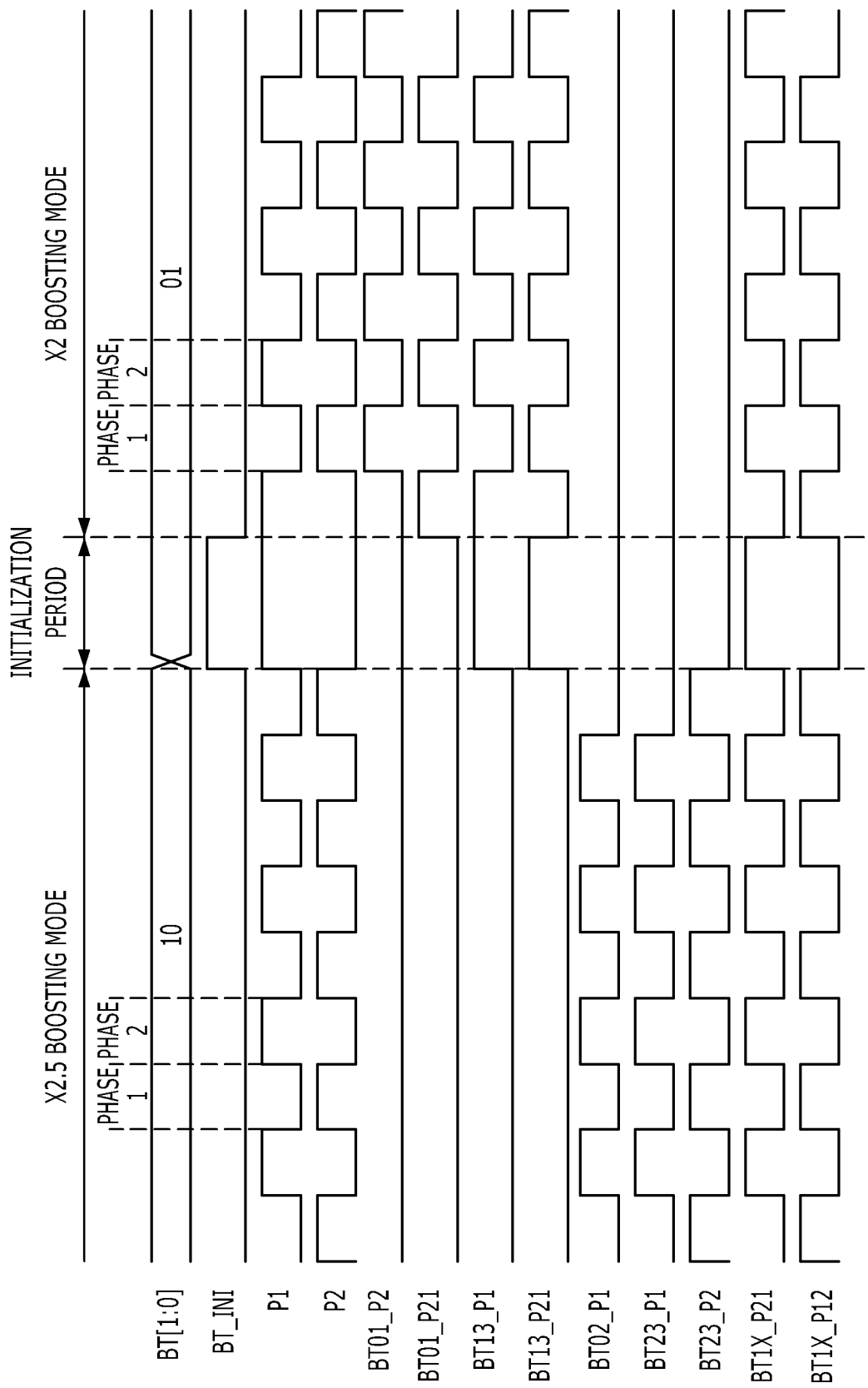

X2.5 PHASE 1

X2.5 PHASE 2

INITIALIZATION PHASE

CHARGE PUMP APPARATUS AND CHARGE PUMPING METHOD

CROSS-REFERENCE TO RELATED APPLICATION(S)

This application claims the benefit under 35 U.S.C. §119 (a) of Korean Patent Application No. 10-2009-109194, filed on Nov. 12, 2009, the entire disclosure of which is incorporated herein by reference for all purposes.

BACKGROUND

1. Field

The following description relates to a charge pump circuit for generating a boosted voltage by boosting an input voltage, and a charge pump method thereof.

2. Description of Related Art

Diverse semiconductor devices operate internal circuits by using a voltage supplied from the exterior. As the kinds of the voltage used in the inside of the semiconductor device are very diverse, it is difficult to supply all the voltages to be used inside a semiconductor device from the exterior. Therefore, a semiconductor device is provided with an internal voltage generation circuit for generating voltage of a new level inside of the semiconductor device.

In particular, a device using a battery as a power source should generate a higher voltage than a power source voltage inputted from the exterior when the level of the power source voltage supplied from the battery is low and the driving voltages to be used in the inside of the semiconductor device are higher than the level of the power source voltage supplied from the battery. A DC-DC converter generates a higher voltage than an inputted voltage. There is a switching mode power supply (SMPS) type of DC-DC converter which uses an inductor. There is also a charge pump type of DC-DC converter which uses a capacitor. In an example of a mobile device, as the current consumption is not high, the charge pump type of DC-DC converter is usually used.

FIGS. 1A and 1B are schematic diagrams illustrating a charge pump circuit boosting an input voltage 1.5 times and outputting a boosted voltage. FIGS. 2A and 2B are schematic diagrams illustrating a charge pump circuit boosting an input voltage 2 times and outputting a boosted voltage.

Referring to FIGS. 1A and 1B, an example in which the input voltage is boosted 1.5 times will be described hereafter. FIG. 1A illustrates a phase 1 operation in which the input voltage is divided in such a manner that a first capacitor 101 and a second capacitor 102 are charged with a voltage of ½*VCIN, individually. FIG. 1B illustrates a phase 2 operation in which the input voltage VCIN is added to the voltage of ½*VCIN charged in the first and second capacitors 101 and 102 and a voltage of 1.5*VCIN is output as a boosted voltage AVDD.

An example in which an input voltage VCIN is boosted twice will be described with reference to FIGS. 2A and 2B. FIG. 2A shows an operation of phase 1 in which the first capacitor 101 is charged with the input voltage VCIN, the input voltage VCIN is added with the voltage of the second capacitor 102, and the sum is output as a boosted voltage AVDD (i.e., AVDD=2*VCIN). FIG. 2B shows an operation of phase 2 in which the second capacitor 102 is charged with the input voltage VCIN and the input voltage VCIN is added to the voltage VCIN of the first capacitor 101 and output as a boosted voltage AVDD (AVDD=2*VCIN). As the operations of FIGS. 2A and 2B are iterated, a voltage of input voltage*2 (i.e., doubled) is output as a boosted voltage AVDD.

Referring to FIGS. 1A and 1B with FIGS. 2A and 2B, while the first and second capacitors 101 and 102 are charged with the voltage of ½*VCIN in FIGS. 1A and 1B, the first and second capacitors 101 and 102 are charged with the voltage VCIN in FIGS. 2A and 2B. In other words, the level of voltage charged in the first and second capacitors 101 and 102 becomes different based on the boosting magnification, which is also referred to as the "boosting mode." Therefore, most of the conventional charge pump circuits are designed not to change the boosting mode during an operation. Although the boosting mode is changed during the operation of a charge pump circuit, a great deal of noise is generated momentarily, which may lead to instable operation of the charge pump circuit.

SUMMARY

In one general aspect, there is provided a charge pumping method, comprising: generating a first boosted voltage by boosting an input voltage by a first boosting mode with a first multiplier; changing the level of a voltage charged in at least one capacitor provided in the inside of a charge pump circuit, in preparation for a change in the boosting mode; and generating a second boosted voltage by boosting the input voltage by a second boosting mode with a second multiplier.

In the method, the generating of the first boosted voltage by boosting the input voltage by the first boosting mode may comprise: charging the capacitor with a first voltage; and generating the first boosted voltage by adding: the first voltage charged in the capacitor; and the input voltage.

In the method, the changing of the level of the voltage charged in at least one capacitor provided in the inside of the charge pump circuit, in preparation for a change in the boosting mode, may comprise changing the voltage charged in the capacitor from the first voltage to a second voltage.

In the method, the generating of the second boosted voltage by boosting the input voltage by the second boosting mode may comprise: charging the capacitor with the second voltage; and generating the second boosted voltage by adding the second voltage charged in the capacitor and the input voltage.

In the method, the generating of the first boosted voltage by boosting the input voltage by the first boosting mode and the generating the second boosted voltage by boosting the input voltage by the second boosting mode may be iterated.

In another general aspect, there is provided a charge pumping method, comprising: charging each of a first capacitor and a second capacitor with a first voltage; generating a first boosted voltage by adding: the first voltage, charged in the first capacitor and the second capacitor; and an input voltage; changing the level of the voltage, charged in the first capacitor and the second capacitor, from the first voltage to a second voltage, in preparation for a change in the boosting mode; charging the first capacitor with the second voltage; generating a second boosted voltage by adding the second voltage, charged in the second boosted capacitor, and the input voltage; charging the second capacitor with the second voltage; and generating the second boosted voltage by adding the second voltage, charged in the first boosted capacitor, and the input voltage.

The method may further include: alternately iterating: the charging of the first capacitor and the second capacitor with a first voltage; and the generating of the first boosted voltage by adding the first voltage, charged in the first capacitor and the second capacitor, and the input voltage; and alternately iterating: the charging of the first capacitor with the second voltage; generating of the second boosted voltage by adding the second voltage, charged in the second boosted capacitor, and the input voltage; the charging of the second capacitor with the second voltage; and generating of the second boosted voltage by adding the second voltage, charged in the first boosted capacitor, and the input voltage.

In the method: the first voltage may comprise a level of half the input voltage; and the second voltage may comprise a level of the input voltage.

In another general aspect, there is provided a charge pumping method, comprising: charging a third capacitor with a voltage obtained by adding: a first voltage, charged in a first capacitor and a second capacitor; and an input voltage; charging the first capacitor and the second capacitor with the first voltage; generating a first boosted voltage by adding a voltage charged in the third capacitor and the input voltage; changing the first voltage charged in the first capacitor and the second capacitor to a second voltage, in preparation for a change in a boosting mode; charging the third capacitor with a voltage obtained by adding: the second voltage, charged in the first capacitor and the second capacitor; and the input voltage; charging the first capacitor and the second capacitor with the second voltage; and generating a second boosted voltage by adding the voltage charged in the third capacitor and the input voltage.

The method may further comprise: alternately iterating: the charging of the third capacitor with the voltage obtained by adding the first voltage, charged in the first capacitor and the second capacitor, and the input voltage; the charging of the first capacitor and the second capacitor with the first voltage; and the generating of the first boosted voltage by adding the voltage charged in the third capacitor and the input voltage; and alternately iterating: the charging of the third capacitor with the voltage obtained by adding the second voltage, charged in the first capacitor and the second capacitor, and the input voltage; the charging of the first capacitor and the second capacitor with the second voltage; and the generating of the second boosted voltage by adding the voltage charged in the third capacitor and the input voltage.

In the method: the first voltage may comprise a level of half the input voltage; and the second voltage may comprise a level of the input voltage.

In another general aspect, there is provided a charge pumping method, comprising: charging a third capacitor with a voltage obtained by adding: a first voltage charged in a first capacitor and a second capacitor; and an input voltage; charging the first capacitor and the second capacitor with the first voltage; generating a first boosted voltage by adding: the voltage charged in the third capacitor; and the input voltage; changing the first voltage, charged in the first capacitor and the second capacitor, to a second voltage, in preparation for a change in a boosting mode; charging the first capacitor with the second voltage; generating a second boosted voltage by adding: the second voltage, charged in the second capacitor; and the input voltage; charging the second capacitor with the second voltage; and generating the second boosted voltage by adding: the second voltage, charged in the first capacitor; and the input voltage.

The method may further comprise: alternately iterating: the charging of the third capacitor with the voltage obtained by adding the first voltage, charged in the first capacitor and the second capacitor, and the input voltage; the charging of the first capacitor and the second capacitor with the first voltage; and the generating of the first boosted voltage by adding the voltage charged in the third capacitor and the input voltage; and alternately iterating: the charging of the first capacitor with the second voltage; the generating the second boosted voltage by adding the second voltage, charged in the second capacitor, and the input voltage; the charging of the second capacitor with the second voltage; and the generating of the second boosted voltage by adding the second voltage, charged in the first capacitor, and the input voltage.

In the method: the first voltage may comprise a level of the input voltage divided by two; and the second voltage may comprise a level of the input voltage.

The method may further comprise discharging the first boosted voltage or the second boosted voltage, in response to the first boosted voltage or the second boosted voltage being higher than a target level.

In another general aspect, there is provided a charge pump circuit for generating a boosted voltage by boosting an input voltage, the charge pump comprising: a plurality of capacitors configured to perform a boosting operation; a switch controller configured to generate a plurality of switch control signals in response to boosting mode information; and a plurality of switches configured to control the plurality of capacitors in response to the plurality of switch control signals, wherein, in response to the boosting mode information being changed during an operation of the charge pump circuit, the switch controller is further configured to generate the plurality of switch control signals to provide a boosting mode period for changing a voltage charged in at least one of the plurality of the capacitors before a boosting operation, based on a changed boosting mode.

The charge pump circuit may further comprise a voltage controller configured to discharge the boosted voltage, in response to the boosted voltage being higher than a target voltage.

In the method, the voltage controller may comprise: a voltage divider connected to the boosted voltage; and a comparator comprising: a first comparator input coupled to a divided boosted voltage; and a second comparator input coupled to a target voltage, wherein the voltage controller is further configured to discharge the boosted voltage based on a comparator output of the comparator, and wherein the target voltage is adjusted in response to the boosting mode information being changed during an operation of the charge pump circuit.

In the method, the boosting mode information may comprise a set of binary codes, each code of the set of binary codes being associated with a respective boosting mode multiplier of a set of boosting mode multipliers.

In the method, in response to the boosting mode information being changed during an operation of the charge pump circuit, the switch controller may be further configured to generate the plurality of switch control signals during an initialization phase that occurs prior to output of a boosted voltage.

Other features and aspects may be apparent from the following detailed description, the drawings, and the claims.

BRIEF DESCRIPTION OF THE DRAWINGS

FIG. 11 is a timing diagram showing changes in signals in response to a boosting mode being changed from ×2.5 to ×2.

Figure 1A:
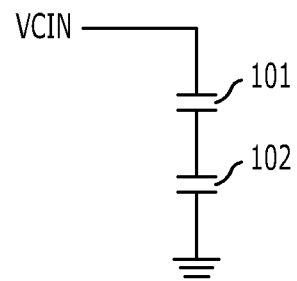
FIGS. 1A and 1B are schematic diagrams illustrating charge pump circuit boosting an input voltage 1.5 times and outputting a boosted voltage.
Figure 1B:
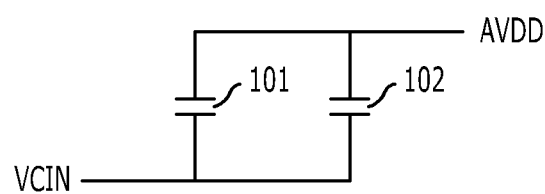
Figure 2A:
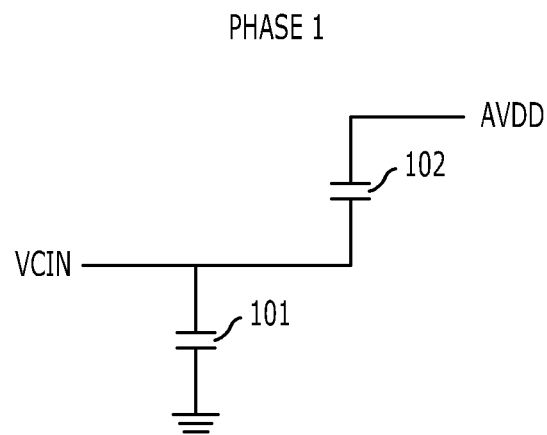
FIGS. 2A and 2B are schematic diagrams illustrating a charge pump circuit boosting an input voltage two (2) times and outputting a boosted voltage.
Figure 2B:
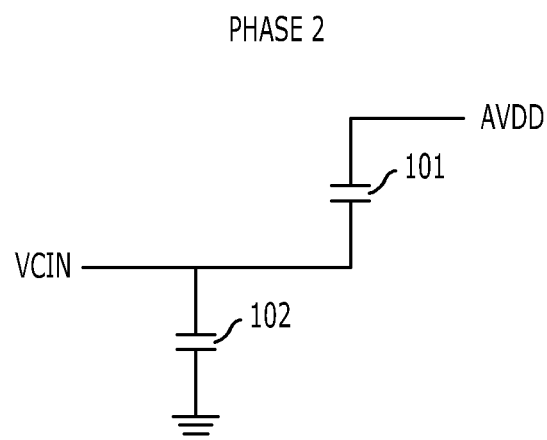

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Figure 3:
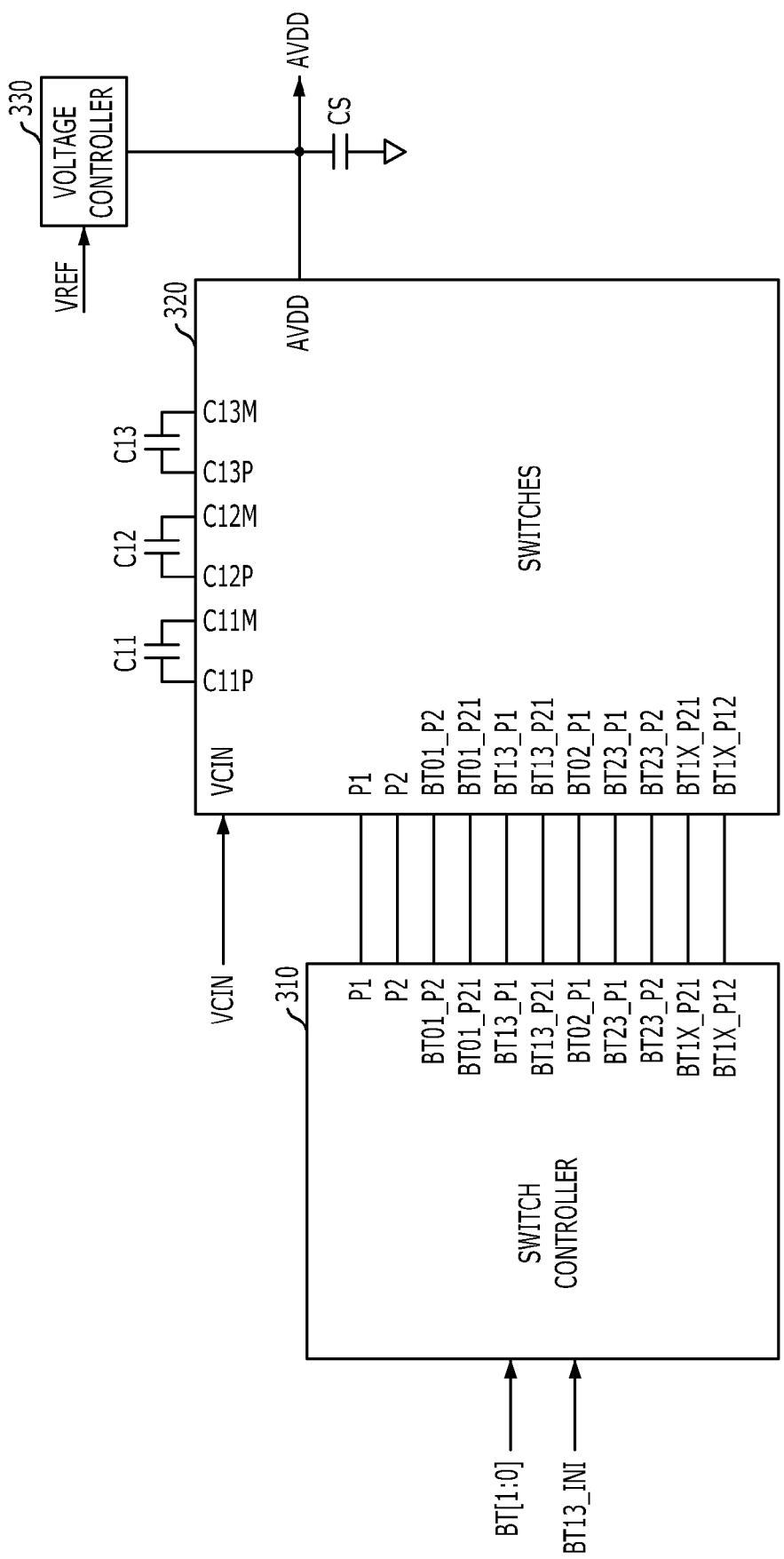
FIG. 3 is a schematic diagram illustrating a charge pump circuit in accordance with an embodiment.

FIG. 3 is a schematic diagram illustrating a charge pump circuit in accordance with an embodiment. Referring to FIG. 3, the charge pump circuit may include a switch controller 310, a plurality of switches 320, a plurality of capacitors C11, C12, and C13, and a voltage controller 330.

The plurality of capacitors C11, C12, and C13 may be provided for a charge pumping operation, and a boosting mode may be different according to the level of voltage charged, or stored, in the capacitors C11, C12, and C13 and how the capacitors C11, C12, and C13 are coupled.

The plurality of switches 320 may control the plurality of capacitors C11, C12, and C13 in response to switch control signals P1, P2, BT01_P2, BT01_P21, BT13_P1, BT13_P21, BT02_P1, BT23_P1, BT23_P2, BT1X_P21, and BT1X_P12. The structure of the charge pump circuit, including the plurality of capacitors C11, C12, and C13, may be different, according to which of the plurality of switches 320 is turned on or off. In the example of FIG. 3, the plurality of switches 320 are illustrated in the form of a block of switches, although embodiments are not limited thereto. The internal structure of the block will be described later with reference to the example of FIG. 4.

The switch controller 310 may generate the switch control signals P1, P2, BT01_P2, BT01_P21, BT13_P1, BT13_P21, BT02_P1, BT23_P1, BT23_P2, BT1X_P21, and BT1X_P12 in response to boosting mode information BT[1:0]. The boosting mode information BT[1:0] may include information on how many times the charge pump circuit will boost an input voltage VCIN to generate a boosted voltage AVDD. The switch controller 310 may perform a control to generate the switch control signals P1, P2, BT01_P2, BT01_P21, BT13_P1, BT13_P21, BT02_P1, BT23_P1, BT23_P2, BT1X_P21, and BT1X_P12. The control may be based on the boosting mode information BT[1:0] to boost the input voltage VCIN as much as the boosting mode may have determined, based on the boosting mode information BT[1:0] in the plurality of switches 320; the plurality of capacitors C11, C12, and C13; the output boosted voltages AVDD out of the plurality of switches 320; and the plurality of capacitors C11, C12, and C13. An initialization signal BT13_INI inputted to the switch controller 310 may be enabled for a predetermined time in response to boosting mode information BT[1:0] being changed. While the initialization signal BT13_INI is enabled, the switch controller 310 may generate the switch control signals P1, P2, BT01_P2, BT01_P21, BT13_P1, BT13_P21, BT02_P1, BT23_P1, BT23_P2, BT1X_P21, and BT1X_P12 such that the voltages charged in the capacitors C11, C12, and C13 may be changed to a new boosting mode. This will be described in detail later.

The voltage controller 330 may be provided to decrease the level of the boosted voltage AVDD in response to the level of the boosted voltage AVDD being increased higher than a target level. The voltage controller may receive a reference voltage VREF. An optional smoothing capacitor CS may be provided. The voltage controller 330 will be described in detail later.

The following Table 1 shows boosting modes based on boosting mode information BT[1:0]. The number following the "×" in the Boosting Mode column indicates the number of times the VCIN will be boosted.

TABLE 1

| BT[1:0] | Boosting Mode |
|---------|---------------|
| 00      | ×1.5          |
| 01      | ×2            |
| 10      | ×2.5          |
| 11      | ×3            |

Figure 4:
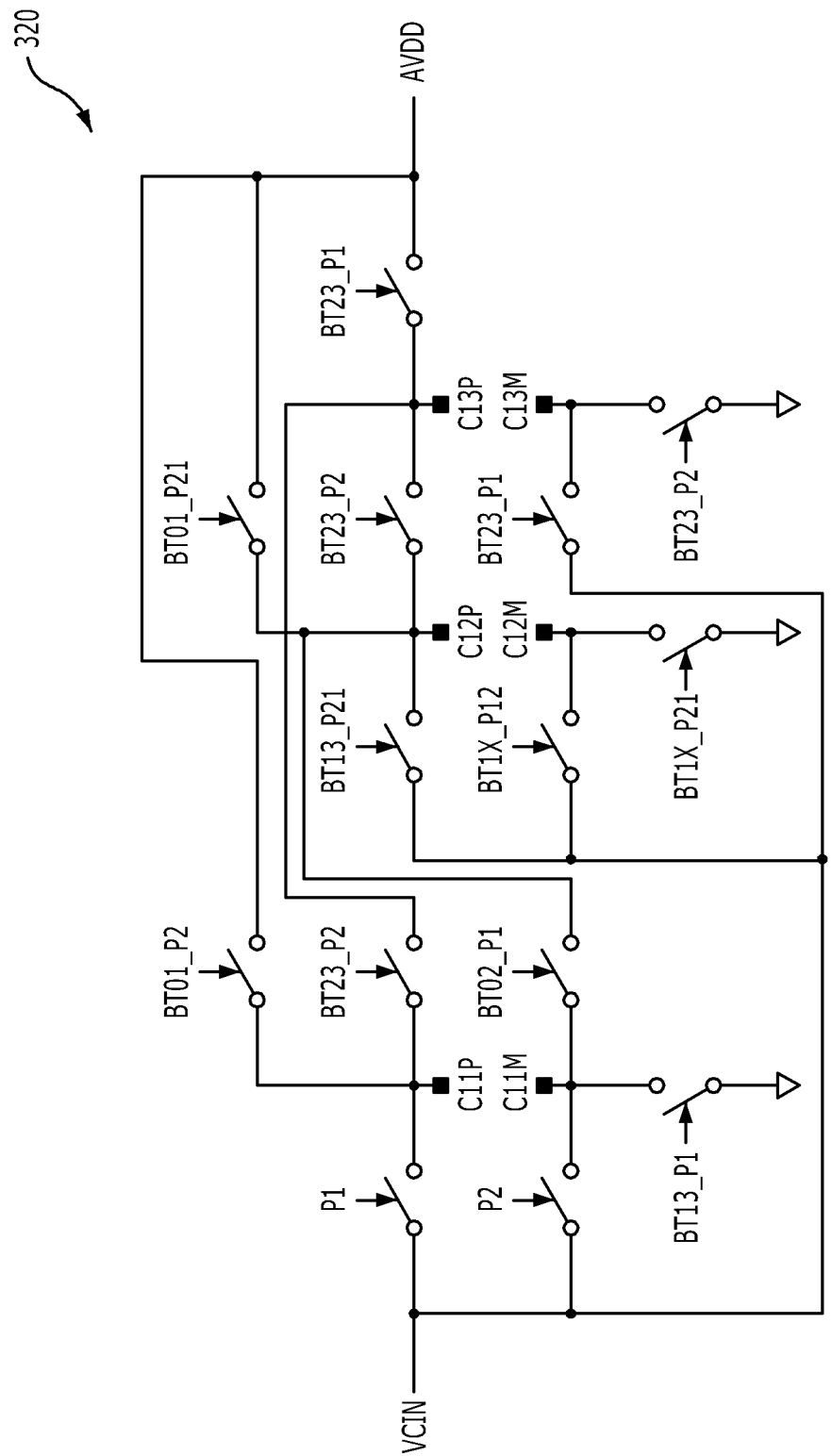
FIG. 4 is a schematic diagram illustrating an internal structure of a block of a plurality of switches shown in FIG. 3.

FIG. 4 is a schematic diagram illustrating an internal structure of a block of switches, e.g., the plurality of switches 320, shown in FIG. 3. Referring to FIG. 4, the block may include the plurality of switches 320 which may be turned on/off in response to the switch control signals P1, P2, BT01_P2, BT01_P21, BT13_P1, BT13_P21, BT02_P1, BT23_P1, BT23_P2, BT1X_P21, and BT1X_P12. In response to the switch control signals P1, P2, BT01_P2, BT01_P21, BT13_P1, BT13_P21, BT02_P1, BT23_P1, BT23_P2, BT1X_P21, and BT1X_P12 being logic high, the switches 320 receiving the switch control signals may be turned on. In response to the switch control signals P1, P2, BT01_P2, BT01_P21, BT13_P1, BT13_P21, BT02_P1, BT23_P1, BT23_P2, BT1X_P21, and BT1X_P12 being logic low, the switches 320 receiving the switch control signals may be turned off. It should be appreciated that any of the above switch operations may be reversed, as desired, for example, logic low turning a switch off. The structure of the charge pump circuit may be changed according to how the switches 320 are turned on/off, and a charge pumping operation may be performed according to the changed circuit structure.

Terminals C11M and C11P illustrated in FIGS. 3 and 4 may be coupled with a first capacitor C11. Terminals C12M and C12P may be coupled with a second capacitor C12.

Terminals C13M and C13P illustrated in FIGS. 3 and 4 may be coupled with a third capacitor C13.

The on/off operations of the switches 320 will be described in detail later with reference to timing diagrams.

Figure 5:
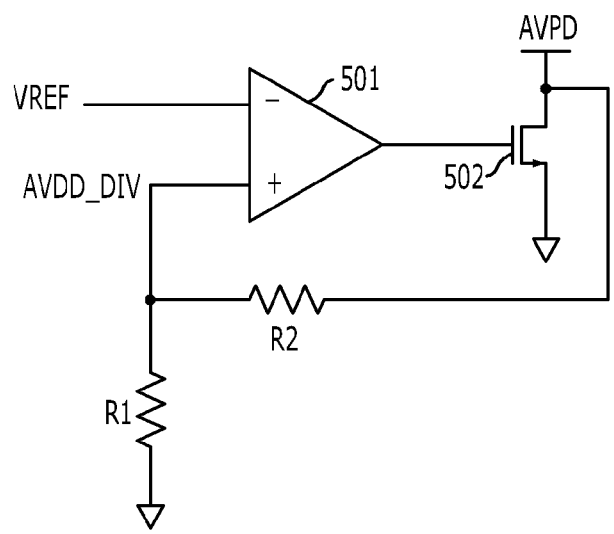
FIG. 5 is a schematic diagram illustrating an internal structure of a voltage controller shown in FIG. 3.

FIG. 5 is a schematic diagram illustrating an internal structure of the voltage controller 330 shown in FIG. 3.

Referring to FIG. 5, the voltage controller 330 may include a comparator 501, a transistor 502, and resistors R1 and R2.

Regarding the operation of the voltage controller 330, a boosted voltage AVDD may be divided by the resistors R1 and R2 into divided boosted voltage AVDD_DIV, and fed back to the comparator 501. The comparator 501 may compare the level of a divided boosted voltage AVDD_DIV with the level of a reference voltage VREF. In response to the level of the divided boosted voltage AVDD_DIV being higher than the level of the reference voltage VREF, the comparator 501 may output an output signal in logic high. In response to the logic-high output signal of the comparator 501, the transistor 502 may be turned on. The transistor 502 being turned on may decrease the level of the boosted voltage AVDD.

The level of the divided boosted voltage AVDD_DIV may be represented by the following Equation 1.

$$AVDD\_DIV = \{R1/(R1+R2)\} * AVDD \quad (1)$$

In response to a level of the divided boosted voltage AVDD_DIV being greater than the reference voltage VREF (AVDD_DIV>VREF), the transistor 502 may be turned on. For example, in response to AVDD_DIV>VREF*(1+R2/R1), the transistor 502 may be turned on, and an operation of discharging the boosted voltage AVDD may be performed.

In embodiments, it may be possible to prevent the boosted voltage AVDD from becoming excessively high by appropriately setting up or providing the reference voltage VREF. As a change in the boosting mode information BT[1:0] may lead to a change in the boosting mode, the target level of the boosted voltage AVDD may be changed. Therefore, in response to the level of the reference voltage VREF being changed based on the boosting mode information BT[1:0], the operation of preventing the boosted voltage AVDD from increasing higher than the target level may be performed more accurately.

Figure 6:
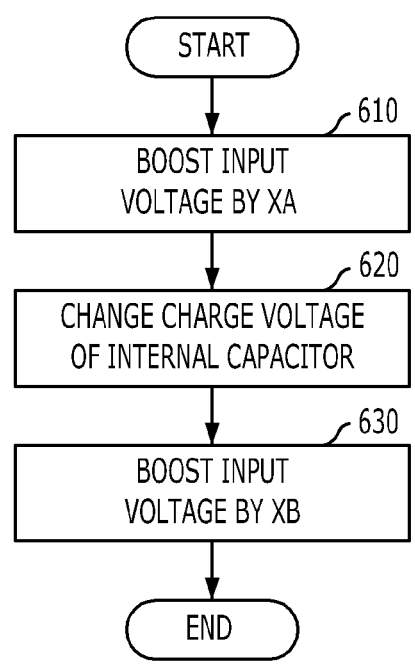
FIG. 6 is a flowchart describing a charge pumping method in accordance with an embodiment.

FIG. 6 is a flowchart describing a charge pumping method in accordance with an embodiment.

Referring to FIG. 6, the charge pumping method may include generating a first boosted voltage AVDD by boosting an input voltage VCIN in a ×A boosting mode in operation 610 (AVDD=A*VCIN), changing the level of voltage charged in at least one of capacitors C11 and C12 provided to the inside of a charge pump circuit in preparation for a change in the boosting mode in operation 620, and generating a second boosted voltage AVDD by boosting an input voltage VCIN in a ×B boosting mode in operation 630 (AVDD=B*VCIN). "A" represents a first boosting mode and "B" represents a second boosting mode, for example, the boosting modes listed in Table 1.

First, in the operation 610, a first boosted voltage AVDD may be generated by boosting an input voltage VCIN in a boosting magnification set at ×A (AVDD=A*VCIN). In operation 620, in response to the boosting mode being changed from ×A to ×B, the charge pump circuit may not directly generate the second boosted voltage AVDD in the ×B boosting mode, but may change the level of voltage charged in the capacitors C11 and C12 inside the charge pump circuit. In response to the boosting mode being changed, the level of voltage charged in the capacitors C11 and C12 may be changed. Therefore, the voltage charged in the capacitors C11 and C12 in response to the boosting mode being set to ×A may be different from the voltage charged in the capacitors C11 and C12 in response to the boosting mode being set to ×B. Therefore, according to the charge pumping method of an embodiment, the level of voltage charged in the capacitors C11 and C12 may be changed before the generation of the second boosted voltage AVDD (AVDD=B*VCIN), based on the new boosting mode. After operation 620, the second boosted voltage AVDD (AVDD=B*VCIN), which may be obtained by boosting the input voltage VCIN in a ×B boosting mode, may be generated. Therefore, the second boosted voltage AVDD (AVDD=B*VCIN) may be generated stably.

According to the charge pumping method of an embodiment, in response to the boosting mode being changed, a period in which the level of voltage charged in the capacitors C11 and C12 inside the charge pump circuit may be provided before the second boosted voltage AVDD (AVDD=B*VCIN) of the new level is generated. Therefore, although the boosting mode may be changed in the middle of an operation in the charge pump circuit, the operation may be performed stably.

Figure 7:
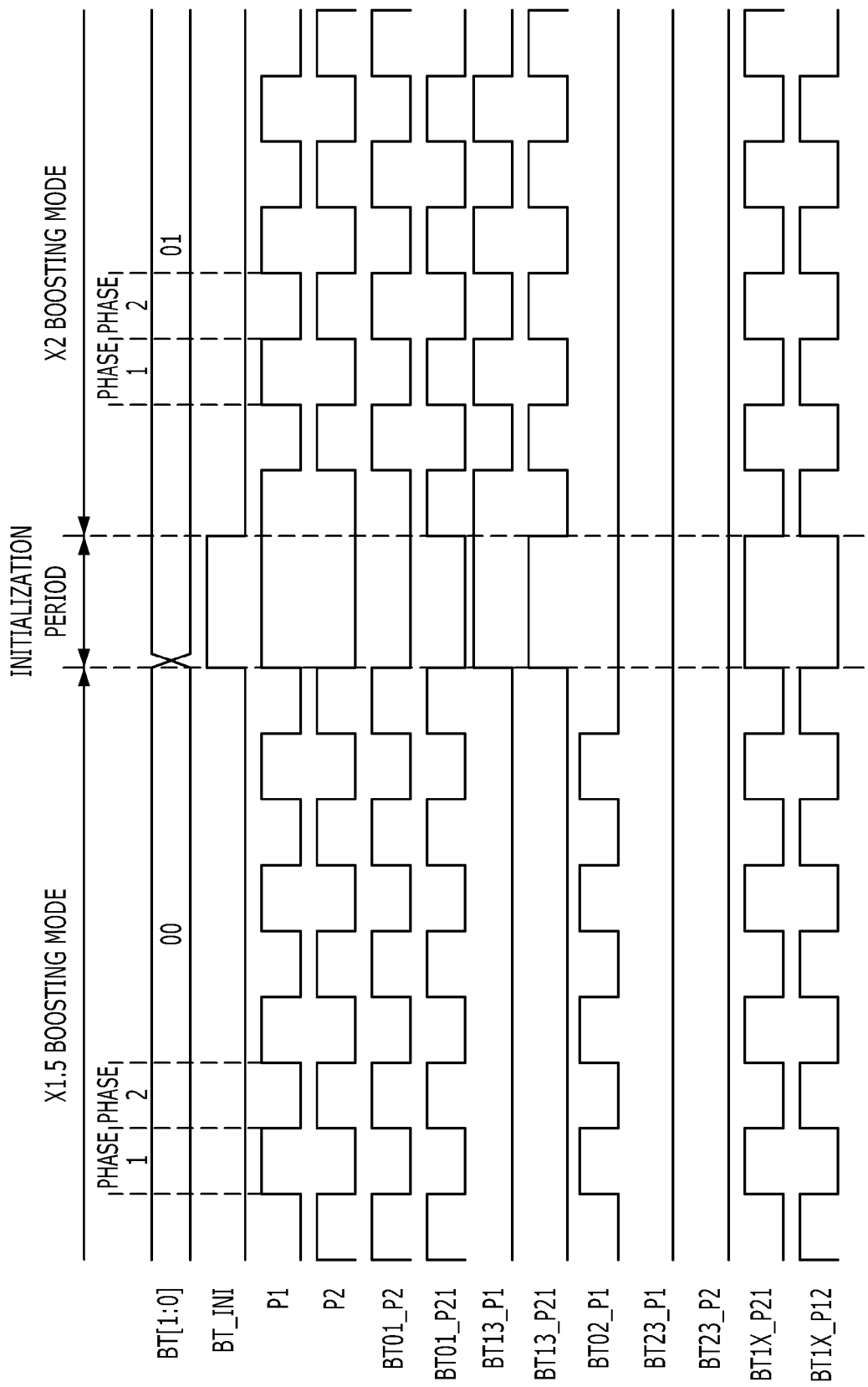
FIG. 7 is a timing diagram showing changes in signals in response to a boosting mode being changed from one and a half times (×1.5) to two times (×2).
Figure 8A:
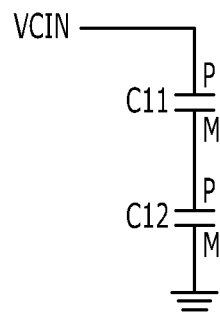
FIGS. 8A, 8B, 8C, 8D, and 8E are schematic diagrams illustrating coupling statuses between a switch and capacitors for each period of FIG. 7.
Figure 8B:
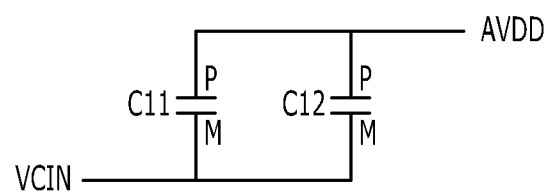
Figure 8C:
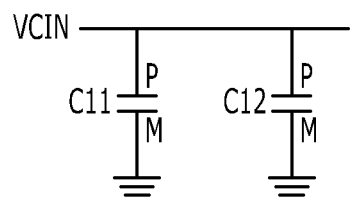
Figure 8D:
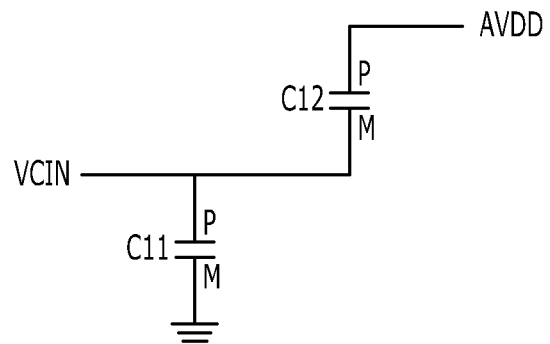
Figure 8E:
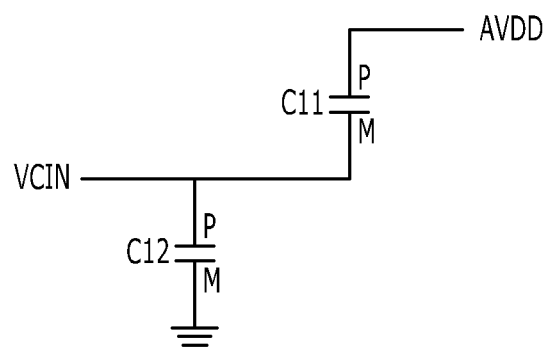

FIG. 7 is a timing diagram showing how signals are changed in response to the boosting mode being changed from ×1.5 to ×2. FIGS. 8A and 8B are schematic diagrams illustrating coupling statuses between a switch 320 and the capacitors C11 and C12 in the ×1.5 boosting mode during phase 1 and phase 2. FIG. 8C is a schematic diagram illustrating coupling statuses between the switch 320 and the capacitors C11 and C12 in the period right before the boosting mode is changed. FIGS. 8D and 8E are schematic diagrams illustrating coupling statuses between the switch 320 and the capacitors C11 and C12 in the ×2 boosting mode during phase 1 and phase 2.

Referring to FIG. 7, during a period in which the boosting mode is set to ×1.5, a phase 1 and a phase 2 may be iterated, and switch control signals P1, P2, BT01_P2, BT01_P21, BT13_P1, BT13_P21, BT02_P1, BT23_P1, BT23_P2, BT1X_P21, and BT1X_P12 may be generated.

In an initialization period for preparing for a change of the boosting mode, that is, in a period in which an initialization signal BT13_INI is enabled, the switch control signals P1, P2, BT01_P2, BT01_P21, BT13_P1, BT13_P21, BT02_P1, BT23_P1, BT23_P2, BT1X_P21, and BT1X_P12 may be generated, as shown in the example of FIG. 7, to change the voltage changed in the capacitors C11 and C12. In a ×2 boosting mode period after the initialization period, phase 1 and phase 2 may be iterated based on the changed boosting mode of ×2, and the switch control signals P1, P2, BT01_P2, BT01_P21, BT13_P1, BT13_P21, BT02_P1, BT23_P1, BT23_P2, BT1X_P21, and BT1X_P12 may be generated.

Referring to FIGS. 8A and 8B, an operation in a period in which the boosting mode is set to ×1.5 will be described. Referring to FIG. 8A, a first capacitor C11 and a second capacitor C 12 may be serially coupled between an input voltage VCIN and a ground terminal in phase 1. Thus, the first capacitor C11 and the second capacitor C12 may be charged with a voltage of ½*VCIN. Referring to FIG. 8B, the first capacitor C11 and the second capacitor C12 may be coupled in parallel in phase 2, and the input voltage VCIN may be applied to M terminals of the first and second capacitors C11 and C12. Therefore, the voltage of P terminals of the first and second capacitors C11 and C12 may become VCIN+½*VCIN, which may be output as a boosted voltage AVDD (e.g., AVDD=1.5*VCIN). In other words, the voltage ½*VCIN charged in the first and second capacitors C11 and C12 may be added with the input voltage VCIN in phase 2, and may be output as a boosted voltage AVDD (e.g., AVDD=1.5*VCIN).

Referring to FIG. 8C, an operation of the initialization period in which a change of the boosting mode is prepared will be described. In this period, the input voltage VCIN may be applied to one terminal of the first capacitor C11, and a ground voltage may be applied to the other terminal of the first capacitor C11. Therefore, the first capacitor C11 may be charged with the input voltage VCIN. Also, the input voltage VCIN may be applied to one terminal of the second capacitor C12, and the ground voltage may be applied to the other terminal of the second capacitor C12. Therefore, the second capacitor C12 may also be charged with the input voltage VCIN. For example, the voltage charged in the first and second capacitors C11 and C12 during the initialization period may be changed from ½*VCIN to VCIN. As described above, in the initialization period in which a change for the boosting mode is prepared, it may be possible to prevent the level of the boosted voltage AVDD (AVDD=2*VCIN) from being unstable or noise from being produced by changing the voltage charged in the first and second capacitors C11 and C12 in advance.

Referring to FIGS. 8D and 8E, an operation in the period set in the boosting mode of ×2 will be described. Referring to FIG. 8D, the input voltage VCIN may be applied to a P terminal of the first capacitor C11, and the ground voltage may be applied to an M terminal of the first capacitor C11 in phase 1. Therefore, the first capacitor C11 may be charged at the level of the input voltage VCIN. As for the second capacitor C12, the input voltage VCIN may be applied to an M terminal of the second capacitor C12, and the boosted voltage AVDD may be output through a P terminal of the second capacitor C12. As the second capacitor C12 may already be charged at the level of the input voltage VCIN, the boosted voltage AVDD may be output through the P terminal of the second capacitor C12 at the level of 2*VCIN. Referring to FIG. 8E, the input voltage VCIN may be applied to the P terminal of the second capacitor C12, and the ground voltage may be applied to the M terminal of the second capacitor C12 in phase 2. As a result, the second capacitor C12 may be charged at the level of the input voltage VCIN. Also, the input voltage VCIN may be applied to the M terminal of the first capacitor C11, and the boosted voltage AVDD may be output through the P terminal of the first capacitor C11. As the first capacitor C11 may already be charged at the level of the input voltage VCIN, the boosted voltage AVDD may be output through the P terminal of the first capacitor C11 at the level of 2*VCIN.

Figure 9:
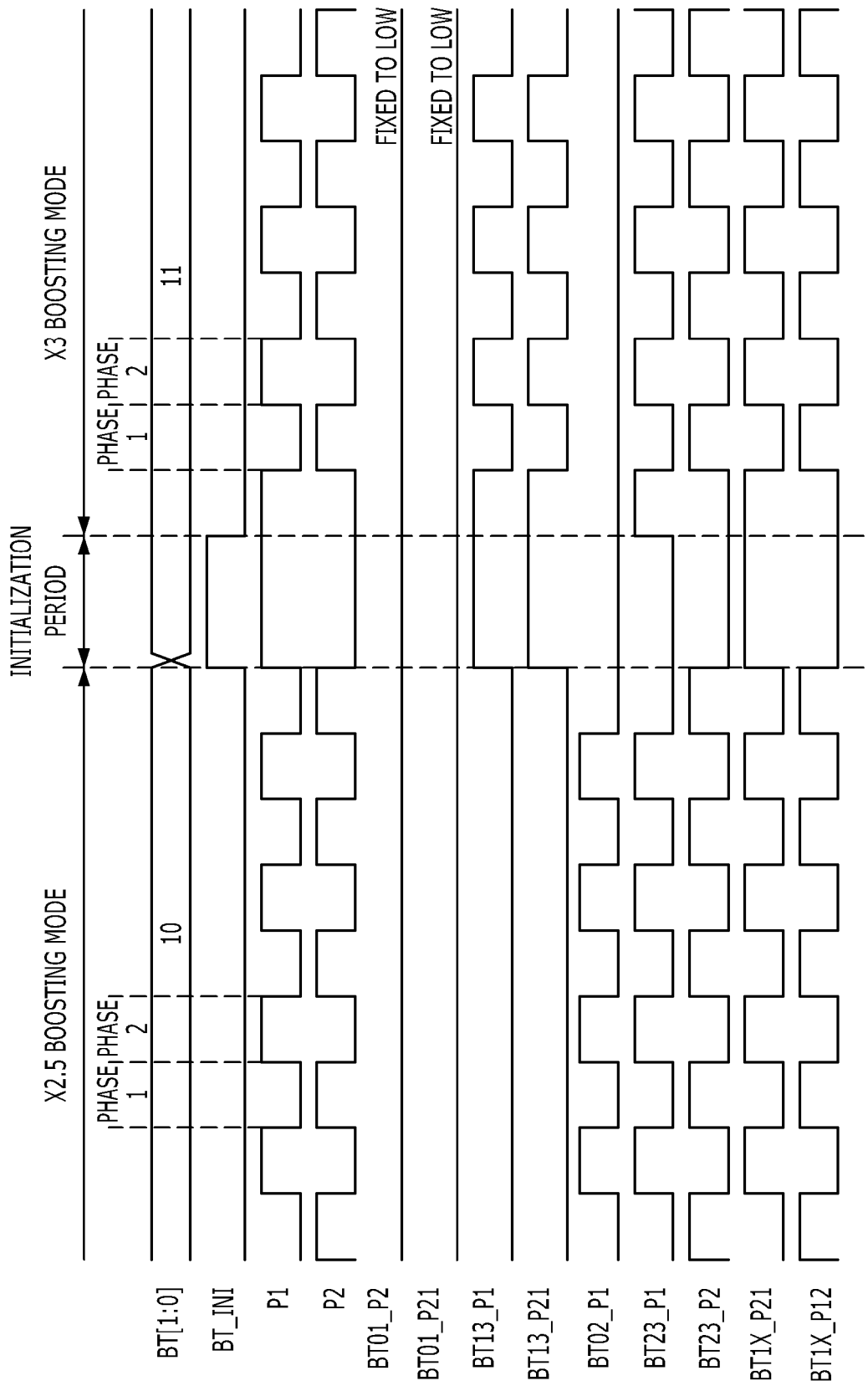
FIG. 9 is a timing diagram showing changes in signals in response to a boosting mode being changed from two and a half times (×2.5) to three times (×3).
Figure 10A:
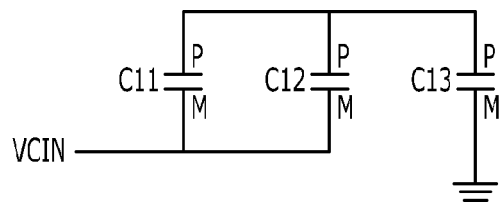
FIGS. 10A, 10B, 10C, 10D, and 10E are schematic diagrams illustrating coupling statuses between a switch and capacitors for each period of FIG. 9.
Figure 10B:
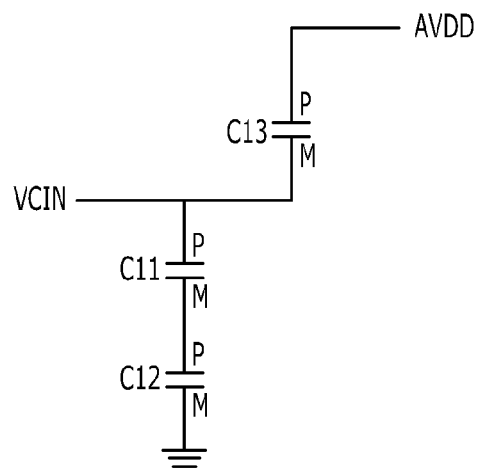
Figure 10C:
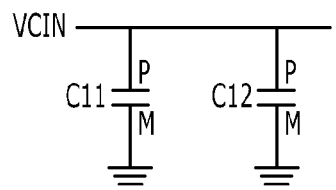
Figure 10D:
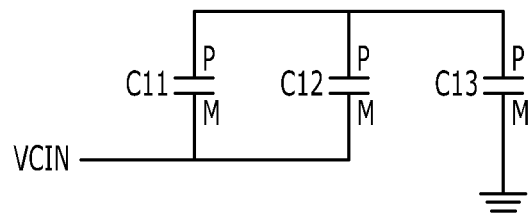
Figure 10E:
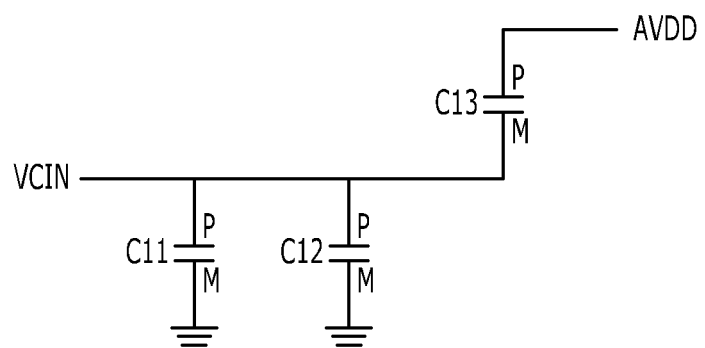

FIG. 9 is a timing diagram showing how signals are changed in response to the boosting mode being changed from ×2.5 to ×3. FIGS. 10A and 10B are schematic diagrams illustrating coupling statuses between the switch 320 and capacitors C11, C12, and C13 in a ×2.5 boosting mode during a phase 1 and a phase 2. FIG. 10C is a schematic diagram illustrating coupling statuses between the switch 320 and the capacitors C11 and C12 in the initialization period which is a period right before the boosting mode is changed. FIGS. 10D and 10E are schematic diagrams illustrating coupling statuses between the switch 320 and the capacitors C11, C12, and C13 in a ×3 boosting mode in phase 1 and phase 2.

Referring to FIG. 9, in the ×2.5 boosting mode, switch control signals P1, P2, BT01_P2, BT01_P21, BT13_P1, BT13_P21, BT02_P1, BT23_P1, BT23_P2, BT1X_P21, and BT1X_P12 may be generated, as a phase 1 and a phase 2 may be iterated. In the initialization period in which a change in the boosting mode may be prepared, that is, in response to an initialization signal BT13_INI being enabled, the switch control signals P1, P2, BT01_P2, BT01_P21, BT13_P1, BT13_P21, BT02_P1, BT23_P1, BT23_P2, BT1X_P21, and BT1X_P12 may be generated to change the voltage level charged in the capacitors C11 and C12, as illustrated in FIG. 8. In a ×3 boosting mode after the initialization period, phase 1 and phase 2 may be iterated based on the changed boosting mode of ×3, and the switch control signals P1, P2, BT01_P2, BT01_P21, BT13_P1, BT13_P21, BT02_P1, BT23_P1, BT23_P2, BT1X_P21, and BT1X_P12 may be generated.

Referring to FIGS. 10A and 10B, an operation in a period in which the boosting mode is set to ×2.5 will be described. Referring to FIG. 10A, a first capacitor C11 and a second capacitor C12 may be coupled in parallel, and the voltage ½*VCIN charged in the first and second first capacitors C11 and C12 may be added with the input voltage VCIN and stored in a third capacitor C13. Therefore, the third capacitor C13 may be charged with a voltage of 1.5*VCIN. Referring to FIG. 10B, the first capacitor C11 and the second capacitor C12 may be serially coupled between the input voltage VCIN and the ground terminal in phase 2. Therefore, the first and second first capacitors C11 and C12 may be charged with a voltage of ½*VCIN. Then, the voltage 1.5*VCIN charged in the third capacitor C13 and the input voltage VCIN may be added thereto, and thus a boosted voltage AVDD (e.g., AVDD=2.5*VCIN) may be output. After the iterated operation of phase 1 and phase 2, a voltage of 2.5*VCIN may be output as the boosted voltage AVDD.

Referring to FIG. 10C, an operation in the initialization period in which a change in the boosting mode is prepared will be described hereafter. During the period, the input voltage VCIN may be applied to one terminal of the first capacitor C11, and a ground voltage may be applied to the other terminal of the first capacitor C11. Therefore, the first capacitor C11 may be charged with the input voltage VCIN. As for the second capacitor C12, the input voltage VCIN may be applied to one terminal of the second capacitor C12, and the ground voltage may be applied to the other terminal of the second capacitor C12. Therefore, the second capacitor C12 may be charged with the input voltage VCIN. For example, the voltage charged in the first and second first capacitors C11 and C12 may be changed from ½*VCIN to VCIN during the period. As described above, it may be possible to prevent the level of the boosted voltage AVDD (e.g., AVDD=3*VCIN) from becoming instable in the next period, which may be the ×3 boosting mode, or noise from being produced by changing the voltage charged in the first and second first capacitors C11 and C12 during the initialization period.

Referring to FIGS. 10D and 10E, an operation in a period in which the boosting mode is set to ×3 will be described hereafter. Referring to FIG. 10D, the first capacitor C11 and the second capacitor C12 may be coupled in parallel in phase 1, and the voltage VCIN charged in the first and second first capacitors C11 and C12 may be added with the input voltage VCIN and stored in the third capacitor C13. Therefore, the third capacitor C13 may be charged with a voltage of 2*VCIN. Referring to FIG. 10E, the input voltage VCIN may be applied to one terminal of the first capacitor C11, and the ground voltage may be applied to the other terminal of the first capacitor C11 in phase 2. Therefore, the first capacitor C11 may be charged with the input voltage VCIN. Also, the input voltage VCIN may be applied to one terminal of the second capacitor C12, and the ground voltage may be applied to the other terminal of the second capacitor C12. Therefore, the second capacitor C12 may be charged with the input voltage VCIN. The input voltage VCIN may be added with the voltage 2*VCIN charged in the third capacitor C13, and output as a voltage of 3*VCIN.

Figure 12A:
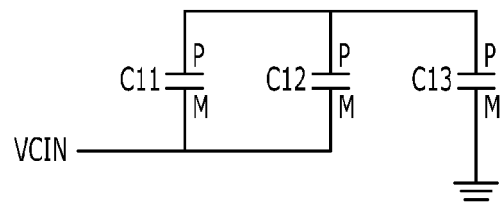
FIGS. 12A, 12B, 12C, 12D, and 12E are schematic diagrams illustrating coupling statuses between a switch and capacitors for each period of FIG. 11.
Figure 12B:
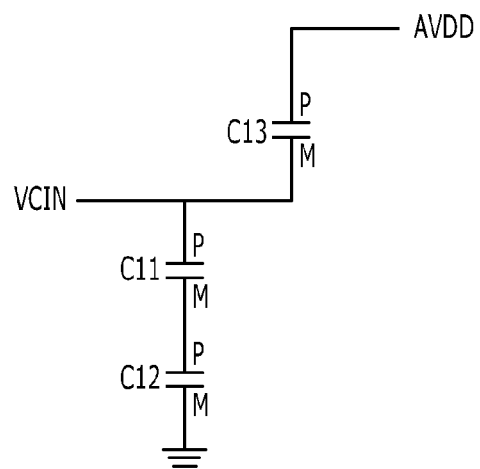
Figure 12C:
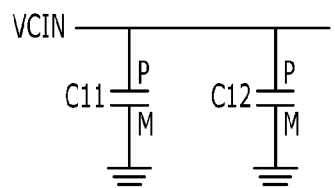
Figure 12D:
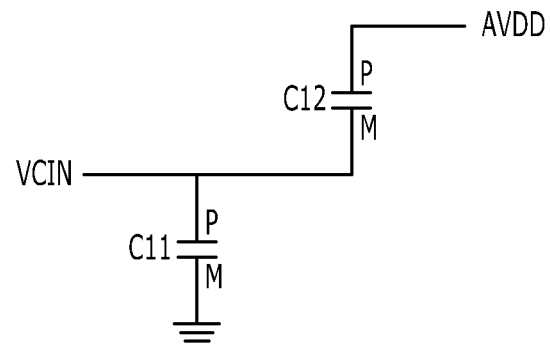
Figure 12E:
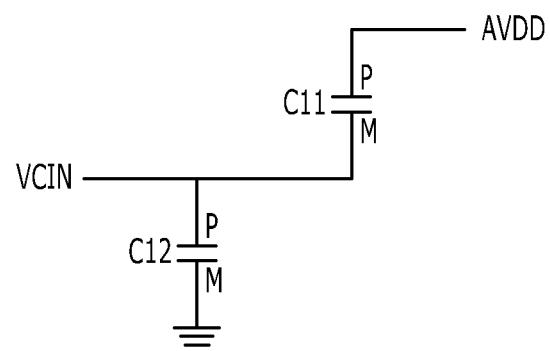

FIG. 11 is a timing diagram showing how signals are changed in response to the boosting mode being changed from ×2.5 to ×2. FIGS. 12A and 12B are schematic diagrams illustrating coupling statuses between the switch 320 and the capacitors C11, C12, and C13 in the ×2.5 boosting mode during phase 1 and phase 2. FIG. 12C is a schematic diagram illustrating coupling statuses between the switch 320 and the capacitors C11 and C12 in the initialization period right before the boosting mode is changed. FIGS. 12D and 12E are schematic diagrams illustrating coupling statuses between the switch 320 and the capacitors C11, C12, and C13 in the ×2 boosting mode during phase 1 and phase 2.

Referring to FIG. 11, in the ×2.5 boosting mode in which the boosting mode may be set to ×2.5, a phase 1 and a phase 2 may be iterated and the switch control signals P1, P2, BT01_P2, BT01_P21, BT13_P1, BT13_P21, BT02_P1, BT23_P1, BT23_P2, BT1X_P21, and BT1X_P12 may be generated. In the initialization period in which a change in the boosting mode may be prepared, that is, in a period in which an initialization signal BT13_INI may be enabled, the switch control signals P1, P2, BT01_P2, BT01_P21, BT13_P1, BT13_P21, BT02_P1, BT23_P1, BT23_P2, BT1X_P21, and BT1X_P12 may be generated as illustrated in FIG. 10, and thus the voltage charged in the first and second first capacitors C11 and C12 may be changed. In a ×2 boosting mode period after the initialization period, phase 1 and phase 2 may be iterated based on the changed boosting mode of ×2, and the switch control signals P1, P2, BT01_P2, BT01_P21, BT13_P1, BT13_P21, BT02_P1, BT23_P1, BT23_P2, BT1X_P21, and BT1X_P12 may be generated.

Referring to FIGS. 12A and 12B, an operation in a period in which the boosting mode is set to ×2.5 will be described. Referring to FIG. 12A, the first capacitor C11 and the second capacitor C12 may be coupled in parallel in phase 1, and the voltage ½*VCIN stored in the first and second first capacitors C11 and C12 coupled in parallel may be added with the input voltage VCIN, and stored in the third capacitor C13. Referring to FIG. 12B, the first capacitor C11 and the second capacitor C12 may be serially coupled between the input voltage VCIN and the ground voltage terminal in phase 2. Therefore, the first and second first capacitors C11 and C12 may be charged with a voltage of ½*VCIN. Then, the voltage 1.5*VCIN charged in the third capacitor C13 and the input voltage VCIN may be added thereto to output a boosted voltage AVDD (e.g., AVDD=2.5*VCIN). The operation of iterating phase 1 and phase 2 may make the voltage of 2.5*VCIN be output as a boosted voltage AVDD.

Referring to FIG. 12C, an operation in the initialization period in which a change in the boosting mode is prepared will be described. During the period, the input voltage VCIN may be applied to one terminal of the first capacitor C11, and the ground voltage may be applied to the other terminal of the first capacitor C11. Therefore, the first capacitor C11 may be charged with the input voltage VCIN. Also, the input voltage VCIN may be applied to one terminal of the second capacitor C12, and the ground voltage may be applied to the other terminal of the second capacitor C12. Therefore, the second capacitor C12 may be charged with the input voltage VCIN. In other words, during the period, the voltage charged in the first and second first capacitors C11 and C12 may be changed from ½*VCIN to VCIN. According to an embodiment, it may be possible to prevent the level of the boosted voltage AVDD (AVDD=2*VCIN) from becoming unstable in the next period, which may be the ×2 boosting mode, or noise from being produced by changing the voltage charged in the first and second first capacitors C11 and C12 during the initialization period.

Referring to FIGS. 12D and 12E, an operation in a period in which the boosting mode is set to ×2 will be described hereafter. Referring to FIG. 12D, the input voltage VCIN may be applied to a P terminal of the first capacitor C11, and the ground voltage may be applied to an M terminal of the first capacitor C11 in phase 1. Therefore, the first capacitor C11 may be charged with the voltage of the level of the input voltage VCIN. As for the second capacitor C12, the input voltage VCIN may be applied to an M terminal of the second capacitor C12, and a boosted voltage AVDD may be output through a P terminal. As the second capacitor C12 may be already charged with a voltage of the level of the input voltage VCIN, a boosted voltage AVDD may be output through the P terminal at the level of 2*VCIN. Referring to FIG. 12E, the input voltage VCIN may be applied to the P terminal of the second capacitor C12, and the ground voltage may be applied to the M terminal of the second capacitor C12 in phase 2. Therefore, the second capacitor C12 may be charged with a voltage of the level of the input voltage VCIN. The input voltage VCIN may be applied to the M terminal of the first capacitor C11, and the boosted voltage AVDD may be applied to the P terminal of the first capacitor C11. As the first capacitor C11 may be already charged with a voltage of the level of the input voltage VCIN, the boosted voltage AVDD may be output through the P terminal of the first capacitor C11 at the level of 2*VCIN.

The charge pumping method according to an embodiment may provide a period for changing the level of voltage charged in a capacitor in advance in preparation for a change in boosting mode. Therefore, although the boosting mode may be changed in the middle of a charge pumping operation, boosted voltage may be generated at a stable level.

In response to the level of the boosted voltage being higher than a target voltage level, boosted voltage may be discharged. Therefore, the charge pumping method according to an embodiment may prevent the level of the boosted voltage from becoming excessively high.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A charge pump circuit, comprising:
 a plurality of capacitors configured to perform a charge pumping operation to generate a boosted voltage by boosting an input voltage in accordance with a boosting mode;
 a switch controller configured to generate one or more switch control signals according to boosting mode information, the generated switch control signals being configured according to the boosting mode information to provide an initialization period during which a voltage level charged in one or more of the plurality of capacitors is changed according to a new boosting mode, the initialization period being provided prior to generation of a new boosted voltage by boosting the input voltage in accordance with the new boosting mode, the new boosting mode corresponding to a change in the boosting mode information occurring during the charge pumping operation; and
 a plurality of switches configured to control the plurality of capacitors according to the generated switch control signals.

2. The charge pump circuit of claim 1, further comprising a voltage controller configured to discharge the boosted voltage, in response to the boosted voltage being higher than a target voltage.

3. The charge pump circuit of claim 2, wherein the voltage controller comprises a comparator, and a voltage divider connected to the boosted voltage, the comparator comprising a first comparator input coupled to a divide boosted voltage, and a second comparator input coupled to the target voltage,
   wherein the voltage controller is further configured to discharge the boosted voltage based on a comparator output of the comparator, and
   wherein the target voltage is adjusted in response to the change in the boosting mode information occurring during the charge pumping operation.

4. The charge pump circuit of claim 1, wherein the boosting mode information comprises a set of binary codes, each code of the set of binary codes being associated with a respective boosting mode multiplier of a set of boosting mode multipliers.

5. A charge pump circuit, comprising:
   a plurality of capacitors configured to perform a charge pumping operation to generate a first boosted voltage by boosting an input voltage by a first boosting mode with a first multiplier, and a second boosted voltage by boosting the input voltage by a second boosting voltage with a second multiplier;
   a plurality of switches configured to control the plurality of capacitors according to one of the first boosting mode and the second boosting mode, and change a level of a voltage charged in one or more of the plurality of capacitors in preparation to change from the first boosting mode to the second boosting mode; and
   a switch controller configured to generate one or more switch control signals to control the plurality of switches according to information received by the switch controller, the information corresponding to the first boosting mode, the second boosting mode, and the changing from the first boosting mode to the second boosting mode.

6. The charge pump circuit of claim 1, wherein the switch control signals are generated in accordance with an initialization signal inputted to the switch controller, the initialization signal being enabled to provide the initialization signal for a predetermined time period according to the change in the boosting mode information occurring during the charge pumping operation.

* * * * *